United States Patent
Gao

(10) Patent No.: US 11,627,687 B2
(45) Date of Patent: Apr. 11, 2023

(54) MULTIPLE PHASE MULTIPLE SYSTEM ARCHITECTURE

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 64 days.

(21) Appl. No.: 17/354,594

(22) Filed: Jun. 22, 2021

(65) Prior Publication Data
US 2022/0408607 A1 Dec. 22, 2022

(51) Int. Cl.
*H05K 7/20* (2006.01)

(52) U.S. Cl.
CPC ..... *H05K 7/20772* (2013.01); *H05K 7/20254* (2013.01); *H05K 7/20318* (2013.01); *H05K 7/20727* (2013.01); *H05K 7/20263* (2013.01); *H05K 7/20272* (2013.01); *H05K 7/20327* (2013.01); *H05K 7/20809* (2013.01); *H05K 7/20836* (2013.01)

(58) Field of Classification Search
CPC .. H05K 7/20763–20781; H05K 7/208–20818; H05K 7/20836; H05K 7/20236; H05K 7/20254; H05K 7/20263; H05K 7/20272; H05K 7/203–20327
See application file for complete search history.

(56) References Cited

U.S. PATENT DOCUMENTS 9,042,099 B2 * 5/2015 Campbell ................. F28F 9/00
361/698

* cited by examiner

*Primary Examiner* — Zachary Pape
(74) *Attorney, Agent, or Firm* — Womble Bond Dickinson (US) LLP

(57) ABSTRACT

A multiple phase cooling system is described for an electronic rack, a cluster of servers, and for a data centers. An inlet of a 3-way flow control valve (FCV) is coupled to a main coolant source. A first outlet of the FCV is coupled to a single-phase cooling system and a second outlet of the FCV is coupled to a two-phase cooling system. The FCV is configured to adjust an amount of coolant between the single-phase cooling system and the two-phase cooling system. Upon detecting a rise in vapor pressure in a return line of the two-phase cooling system, the FCV can be adjusted to direct more coolant to the two-phase cooling system and less coolant to the single-phase system. The FCV can continuously monitor the vapor pressure and adjust the amount of coolant to each cooling system accordingly.

20 Claims, 7 Drawing Sheets

MULTIPLE PHASE MULTIPLE SYSTEM ARCHITECTURE

FIELD OF THE INVENTION

Embodiments of the present invention relate generally to data center cooling. More particularly, embodiments of the invention relate to a multiple phase, multiple cooling system architecture for cooling servers in racks, clusters, or a data center.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling high performance servers.

A server rack in a data center may contain servers having different types of electronic components that generate heat that needs to be removed by a cooling system. Different electronic components can have substantially differing thermal loads. Typically, heat generated within a server system, or a rack of server systems, is removed using a single phase cooling system. A single-phase cooling system is a cooling system in which the coolant, or working fluid, remains in a liquid state. The rack-level distribution of coolant to remove heat is a single failure point.

In the prior art, rack-level cooling is performed by a single-phase system that pumps coolant to the server rack and transfers heat to the coolant. The coolant is then returned to a cooling system to remove the heat from the coolant. A speed of the pump that pumps coolant to the server rack may need to be varied to remove variable amounts of heat generated by components within the server rack. As the heat load increases, the pump speed may not be able to be further increased. Further, increasing the pump speed beyond a certain design point becomes an inefficient way to remove heat. In addition, the pump may fail thereby causing the single-phase system to be unable to remove heat from the heat-generating components. Thus, whether by failure of the pump to operate, or the pump being unable to be run fast enough to remove the amount of heat generated, the single-phase system may include a single point of failure for cooling the heat-generating components within the server rack in existing cooling systems.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1A:
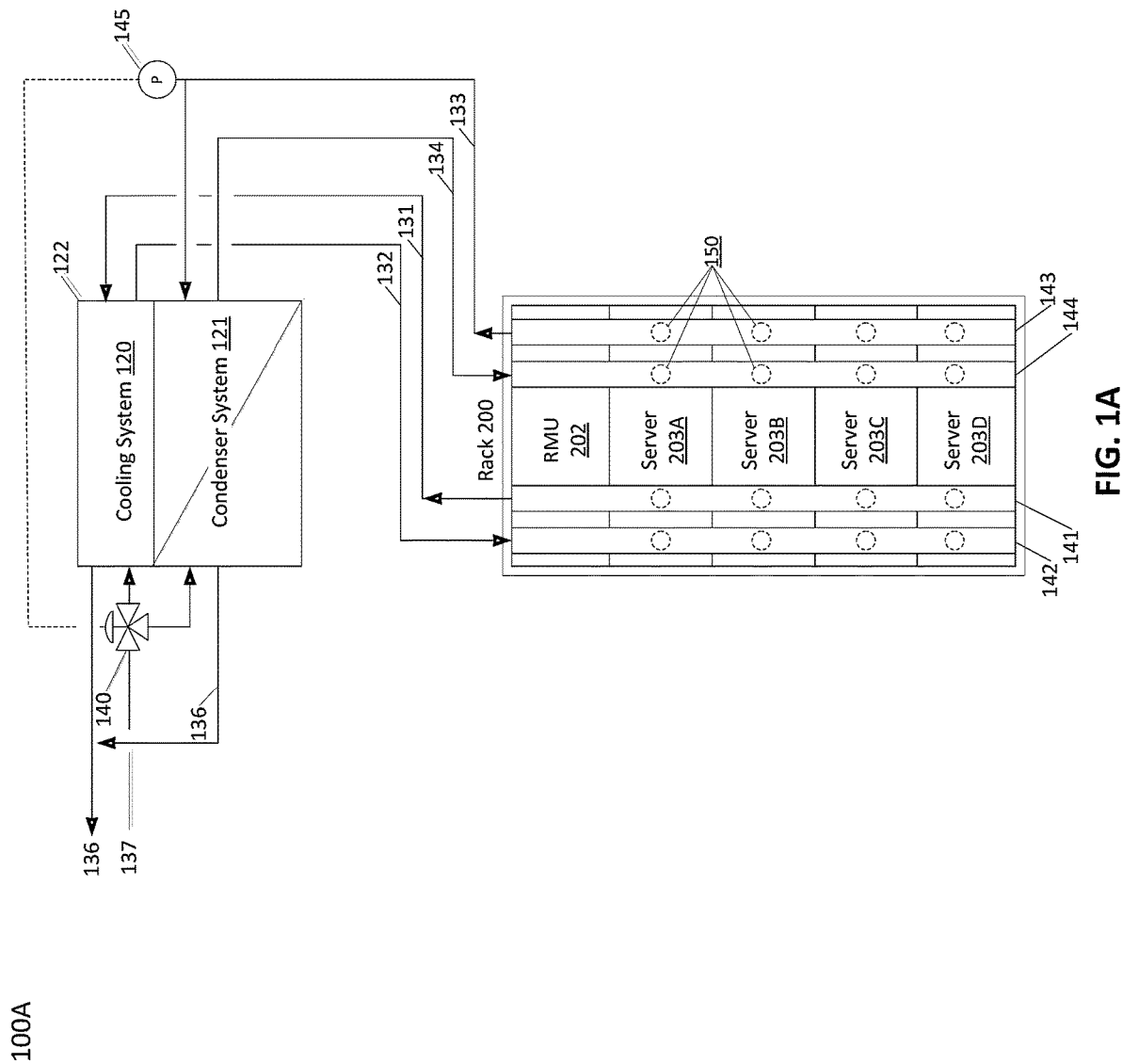
FIG. 1A is a block diagram illustrating an example of an electronic rack according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In a first aspect, an electronic rack cooling system is configured to cool heat-generating components in a plurality of servers installed in the electronic rack. The cooling system includes a flow control device, a first cooling system, and a second cooling system. An inlet port of the flow control device is coupled to a main cooling fluid source, such as a facility cooling fluid source. The first cooling system is coupled to the facility cooling fluid source via a first outlet port of the flow control device. The first cooling system can be a single-phase cooling system. The second cooling system is coupled to the facility cooling fluid source via a second outlet port of the flow control device. The second cooling system can be a two-phase cooling system.

A two-phase, or "phase-change," cooling system is a cooling system in which a coolant, or working fluid, of the cooling system is selected such that the coolant is intended to evaporate in the process of removing heat from heat-generating components. A sensor is coupled to the flow control device via a controller and to a vapor return line of the second cooling system. The flow control device is configured to adjust facility cooling liquid flow received from the facility cooling liquid source to the first and/or second cooling systems, in response to a control command or signal received from the controller based on a sensor signal received from the sensor. The sensor continuously reads vapor pressure of the vapor return line of a two-phase cooling loop of the second cooling system.

In response to readings of the sensor varying in value, the controller sends a control signal or command to instruct the flow control device to adjust an amount of the facility cooling fluid between the first and second cooling systems. In an embodiment, the flow control device can be a 3-way control valve. The 3-way control valve can adjust facility cooling liquid flow so that all of the facility cooling liquid delivered by the facility cooling fluid source goes to either the first cooling system or the second cooling system, or, a variable portion of the facility cooling fluid received from the facility cooling fluid source goes to the first cooling system or the second cooling system, in accordance with one or more sensor values obtained from the sensor.

In an embodiment, the flow control device can be two, 2-way control valves each having an inlet port coupled to the facility cooling fluid source. The first 2-way control valve can have an outlet port coupled to a coolant inlet of the first cooling system and the second 2-way control valve can have an outlet port coupled to a coolant inlet of the second cooling system. The sensor can be a pressure sensing device that measures vapor pressure in the two-phase cooling loop in the second cooling system. In an embodiment, the first cooling system comprises a single-phase cooling system configured to remove heat from single-phase cooling fluid circulating in a first cooling loop of the first cooling system.

The first cooling loop removes heat from a first plurality of heat-generating components in at least one of the plurality of electronic racks. In an embodiment, the second cooling system is configured to remove heat from a second plurality, and/or the first plurality, of heat-generating components within the server rack. The second cooling system can comprise a two-phase condenser system that is configured to remove heat from vapor of two-phase coolant of a second cooling loop of the second cooling system. The first cooling system and the second cooling system can be integrated into a single cooling system which combines the two cooling systems.

In a second aspect, a multiple phase cooling system is configured to cool heat-generating components in a cluster of servers in one or more electronic racks. The server cluster cooling system can have the multiple-phase multiple cooling system architecture and functionality substantially as described above in the first aspect for a single electronic rack, with the following features. In the server cluster cooling system that includes one or more electronic racks, a first cooling loop of the first cooling system provides single-phase cooling fluid to a first single-phase cooling fluid supply manifold in each electronic rack. Any server within an electronic rack can have heat-generating components within the electronic rack that are to be cooled by the first cooling system.

The server can be coupled to the single-phase cooling fluid supply manifold for the rack. Heat generated by these components is removed through heat-transfer within the servers by one or more cold plates coupled to the single-phase cooling fluid supply, and/or a two-phase coolant supply of a second cooling loop of a second cooling system, and the heat is removed from the electronic rack by single-phase cooling fluid return line of the single-phase cooling system and/or a vapor return line of the two-phase cooling system. The single-phase cooling fluid return line from each rack is coupled to a single single-phase cooling fluid return line that is returned to the first cooling system.

Similarly, a second cooling loop of the second cooling system provides a two-phase coolant supply to a second two-phase coolant supply manifold in each electronic rack. Any server within an electronic rack can have heat-generating components within the electronic rack that are to be cooled by the second cooling system. The server can be coupled to the second two-phase coolant supply manifold for the electronic rack. Heat generated by these components is removed through heat-transfer from components coupled to cold plate(s) within the servers to the second two-phase coolant supply and the heat is removed from the electronic rack by a vapor return line.

The vapor return line from each rack is coupled to a single vapor return line that is returned to the second cooling system. A sensor is coupled to the single vapor return line for all electronic racks in the server cluster. The sensor measures vapor pressure within the single vapor return line for the server cluster. An increase in vapor pressure indicates an increase in heat load within the second cooling loop of the second cooling system. As in the first aspect, above, variation in the vapor pressure in the vapor return line for the server cluster results in the flow control device adjusting an amount of facility cooling fluid to each of the first and second cooling systems.

In a third aspect, a data center cooling system that cools heat-generating components within a plurality of servers and a plurality of electronic racks can be substantially as described above for the first and second aspects with the following features. In the data center cooling system, a quantity of servers and electronic racks may be substantially greater than in the server cluster aspect, such that each cooling system may have one or more cooling loops. In an embodiment, the multiple cooling loops for the first cooling system may be joined in a central location, such as at the first cooling system. The multiple cooling loops for the second cooling system may be joined in a central location, such as at the second cooling system. The vapor pressure sensor can be coupled to the single vapor return line at a place where the multiple two-phase cooling loops are joined.

FIG. 1A is a block diagram illustrating an example of a cooling system 100A for an electronic rack 200 according to one embodiment. A cooling system 100A for an electronic rack 200 includes a first cooling system 120 and a second cooling system 121. In an embodiment, cooling systems 120 and 121 can be integrated into a single cooling system. A main cooling liquid source 137 can be a facility cooling liquid source that may originate from, e.g., a cooling tower, a chiller, or other large scale cooling source. A facility cooling fluid return line 136 returns warmed cooling fluid that has removed heat from one or both of a first cooling loop of the first cooling system 120 and/or a second cooling loop of the second cooling system 121. An inlet of a 3-way flow control device 140 is coupled to the facility cooling liquid supply 137. A first outlet from the 3-way flow control device 140 is coupled to a single-phase cooling fluid supply connection on first cooling system 120. A second outlet from the 3-way flow control device 140 is coupled to a two-phase cooling fluid supply connection of the second cooling system 121. The 3-way flow control device 140 adjusts flow of cooling fluid from the facility cooling fluid supply line 137 to the first and second cooling systems 120 and 121. In an embodiment, the 3-way flow control device is a 3-way control valve. In an embodiment, 3-way flow control device 140 can be two 2-way flow control valves operating independently or dependently, each with an inlet coupled to the facility cooling fluid supply line 137 and each with an outlet coupled to the facility cooling fluid supply connection of one of the two cooling systems 120 and 121.

First cooling system 120 can be a single-phase cooling system that includes a first cooling loop. The first cooling loop provides single-phase cooling fluid supply 132 to a single-phase cooling fluid distribution manifold 142 in the electronic rack 200. Electronic rack 200 can include one or more servers, e.g., servers 203A . . . 203D (individually and collectively, "server 203" unless otherwise stated). Each server 203 can include one or more heat-generating components such as central processing units, graphics processing units, artificial intelligence accelerators, and the like. A first plurality of heat-generating components within servers 203A ... 203D can be coupled to one or more cold plates (not shown) in servers 203A ... 203D. Each cold plate can be coupled to the first cooling loop single-phase cooling fluid supply 132 via single-phase cooling fluid supply distribution manifold 142. Each server 203 can be connected to single-phase cooling fluid supply 132 via a connection 150 on single-phase cooling fluid supply distribution manifold 142. Server 203 can route the single-phase cooling fluid from single-phase cooling fluid supply line 132 to one or more heat-generating components within the server 203. A cold plate (not shown) transfers heat from one or more heat-generating components in a server 203 to the coolant supplied by cooling fluid supply 132. The cold plate (not shown) transfers heat to a cooling fluid return line 131 that is routed back to the cooling system 120. In an embodiment, the single-phase cooling fluid in the first cooling loop of the first cooling system 120 is a first working fluid having a vaporization temperature that is higher than a design temperature for the cooling loop, such that the single-phase cooling fluid in the first cooling loop is not designed to vaporize during normal, design, heat loads.

Second cooling system 121 can be a two-phase cooling system. In an embodiment, the working fluid in a second cooling loop of the second cooling system 121 is selected such that the working fluid will vaporize at a temperature that is within a design operating range of a second plurality of heat-generating components within the one or more servers 203 in the electronic rack 200. The second plurality of heat-generating components can have a different design temperature range than the first plurality of heat-generating components. The second plurality of heat-generating components within servers 203A ... D can be coupled to one or more cold plates (not shown) in servers 203A ... 203D.

Each cold plate can be coupled to the second cooling loop two-phase coolant supply 134 via two-phase coolant distribution manifold 144. Servers 203 can route the two-phase coolant to one or more cold plates to which one or more heat-generating components are coupled. The one or more a cold plates (not shown) within a server 203 transfer heat from one or more heat-generating components to the coolant two-phase coolant supply line 134, which then becomes vapor in return line 133. Each server 203 can have a connection 150 that couples the vapor return line in the server 203 to a vapor return manifold 143 that routes the vapor 133 back to the two-phase cooling system 121.

A pressure sensor 145 is installed into vapor return line 133. Vapor pressure within vapor return line 133 will rise as the second working fluid evaporates. Changes in the vapor pressure within the vapor return line 133 are detected by pressure sensor 145. Pressure sensor 145 can signal a controller (not shown), which in turn sends a control signal or command to instruct the 3-way flow control device 140 to adjust the amount of facility cooling liquid from the facility cooling fluid supply line 137 between the first and second cooling systems, in response to the changes in vapor pressure in vapor return line 133.

In an example, as the vapor pressure in vapor return line 133 increases, the 3-way control device can increase the flow of facility cooling fluid supply line 137 to the second cooling system 121. As the pressure sensor 145 detects the vapor pressure falling, the 3-way flow control device can direct less facility cooling fluid supply to the second cooling system 121. Second cooling system 121 can include a condenser such that increasing the amount of facility cooling fluid from the facility cooling fluid supply line 137 to the second cooling system 121 can quench, or condense, and thereby cool, the second working fluid or vapor within the second cooling loop of the second cooling system 121. The cooled second working fluid can be recycled to the two-phase coolant supply line 134 for additional heat removal within the electronic rack 200.

In an embodiment, the two cooling systems 120 and 121 can operate in parallel in a combined manner. In such operation, pressure can be used for tuning an optimized combination operation of system 120 and 121. The facility cooling fluid supply line 137 and facility cooling fluid return line 136 is managed and distributed between cooling systems 120 and 121 for redundant design, and optimized performance.

In an embodiment, the first plurality of heat-generating components cooled by the first cooling loop can be the same plurality of heat-generating components as the second plurality of heat-generating components that can be additionally, or alternatively, cooled by the second cooling loop. The second cooling system 121 can be operated as a fully redundant cooling system with the first cooling system 120 such that a same plurality of heat-generating components in one or more servers is cooled by the first cooling system, the second cooling system, or a controllably variable combination of both the first and second cooling systems. In an embodiment, electronic rack 200 can also include a rack management unit 202. RMU 202 is described in detail, below, with reference to FIG. 2.

Figure 1B:
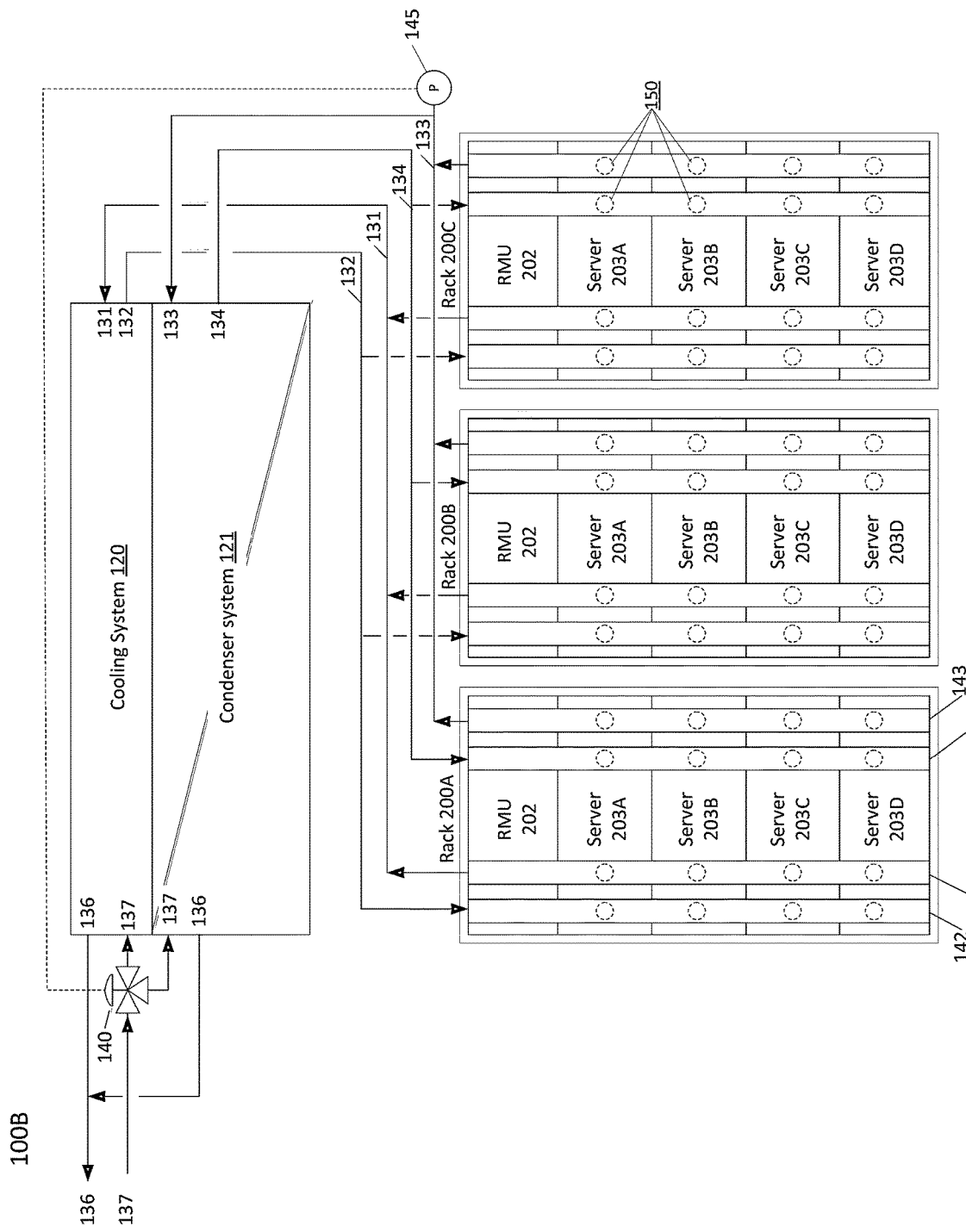
FIG. 1B is a block diagram illustrating an example of a cluster of servers in electronic racks according to one embodiment.

FIG. 1B is a block diagram illustrating an example of cooling system having multiple phases and multiple cooling systems for cooling a cluster of servers 100B according to one embodiment. The cooling system for the cluster of servers 100B is substantially identical to the cooling system for an electronic rack 100A, described above with reference to FIG. 1A, with a main difference being that, in the server cluster, there are more electronic racks and servers to cool than the single electronic rack 100A in FIG. 1A.

The cooling system 100B for the cluster of servers includes a plurality of electronic racks, e.g. electronic racks 200A, 200B, and 200C (collectively and individually, "electronic rack 200," unless otherwise noted). First cooling system 120 can be a single-phase cooling system having a first cooling loop that includes single-phase cooling fluid supply line 132 and single-phase cooling fluid return line 131. The first cooling loop removes heat from a first plurality of heat-generating components within one or more servers in the plurality of electronic racks 200 in the server cluster.

Single-phase cooling fluid supply line 132 supplies cooling fluid to each of the electronic racks 200 in the server cluster having a server with at least one heat-generating component in the first plurality of heat-generating components. For each electronic rack 200 the single-phase cooling fluid supply line 132 is coupled to a single-phase cooling fluid supply distribution manifold 142 in the electronic rack 200. Each electronic rack 200 having a server 203 with at least one heat-generating component in the first plurality of heat-generating components also has a single-phase cooling fluid return manifold 141 in the electronic rack 200.

Each of the single-phase cooling fluid return manifolds 141 in electronic racks 200A-200C of the server cluster couple to a single single-phase cooling fluid return line 131 that returns single-phase cooling fluid 131 to the first cooling system 120. First cooling system 120 removes heat received from the single-phase cooling fluid return line 131 and recycles the now-cooled cooling fluid as single-phase cooling fluid supply 132.

Second cooling system 121 can be a two-phase cooling system having a second cooling loop that includes two-phase coolant supply line 134 and vapor return line 133. A second working fluid in the two-phase cooling system 121 can be different from a first working fluid of the first cooling system 120. The second working fluid can be selected to evaporate within a design operating temperature range of a second plurality of heat-generating components within the server cluster. The second cooling loop removes heat from the second plurality of heat-generating components within one or more servers 203 in the plurality of electronic racks 200 in the server cluster.

Two-phase coolant supply line 134 supplies coolant to each of the electronic racks 200 in the server cluster having a server 203 with at least one heat-generating component in the second plurality of heat-generating components. For each electronic rack 200 the two-phase coolant supply line 134 is coupled to a two-phase coolant supply distribution manifold 144 in the electronic rack 200. Each electronic rack 200 having a server 203 with at least one heat-generating component in the second plurality of heat-generating components also has a vapor return manifold 143 in the electronic rack 200. Each of the vapor return manifolds 143 in the electronic racks 200 of the server cluster couples to a single vapor return line 133 that is coupled to the second cooling system 121. Second cooling system 121 removes heat from the vapor return line 133 and recycles the now-cooled vapor as two-phase coolant supply 134.

Pressure sensor 145 can be coupled to the single vapor return line 133 at a point downstream of where all of the vapor return manifolds 143 in the racks 200 are joined to the single vapor return line 133. Sensor 145 can measure a vapor pressure within vapor return line 133. As described above, with reference to FIG. 1A, flow control device 140 can adjust an amount of facility cooling fluid supplied from facility cooling fluid supply line 137 to each of cooling systems 120 and 121, in response to changes in vapor pressure detected by sensor 145. A facility cooling fluid return line 136 returns warmed cooling fluid that has heat removed from one or both of the first cooling loop of the first cooling system 120 and/or the second cooling loop of the second cooling system 121.

In an embodiment, each vapor loop of each electronic rack includes a pressure sensor 145 before converging to the single vapor return loop 133. A single, server cluster vapor loop pressure can be mathematically derived from the pressure sensors 145 in each vapor loop of each electronic rack, if the racks are all configured and populated very similarly or identically. A mathematically derived pressure can be, e.g., an average, a weighted average, a highest-value from among the pressure sensors 145, and the like. The derived pressure value can then be used to actuate the 3-way flow control device 140 for adjusting a facility cooling fluid to each of the first and second cooling systems. In an embodiment, each rack vapor return 133 may include a pressure sensor 145 (not shown).

As described above for a single server 203 with respect to FIG. 1A, in an embodiment as in FIG. 1B, the first plurality of heat-generating components cooled by the first cooling loop can be the same plurality of heat-generating components as the second plurality of heat-generating components that can be additionally, or alternatively, cooled by the second cooling loop. The second cooling system 121 can be operated as a fully redundant cooling system with the first cooling system 120 such that a same plurality of heat-generating components in one or more servers is cooled by the first cooling system, the second cooling system, or a controllably variable combination of both the first and second cooling systems.

Figure 1C:
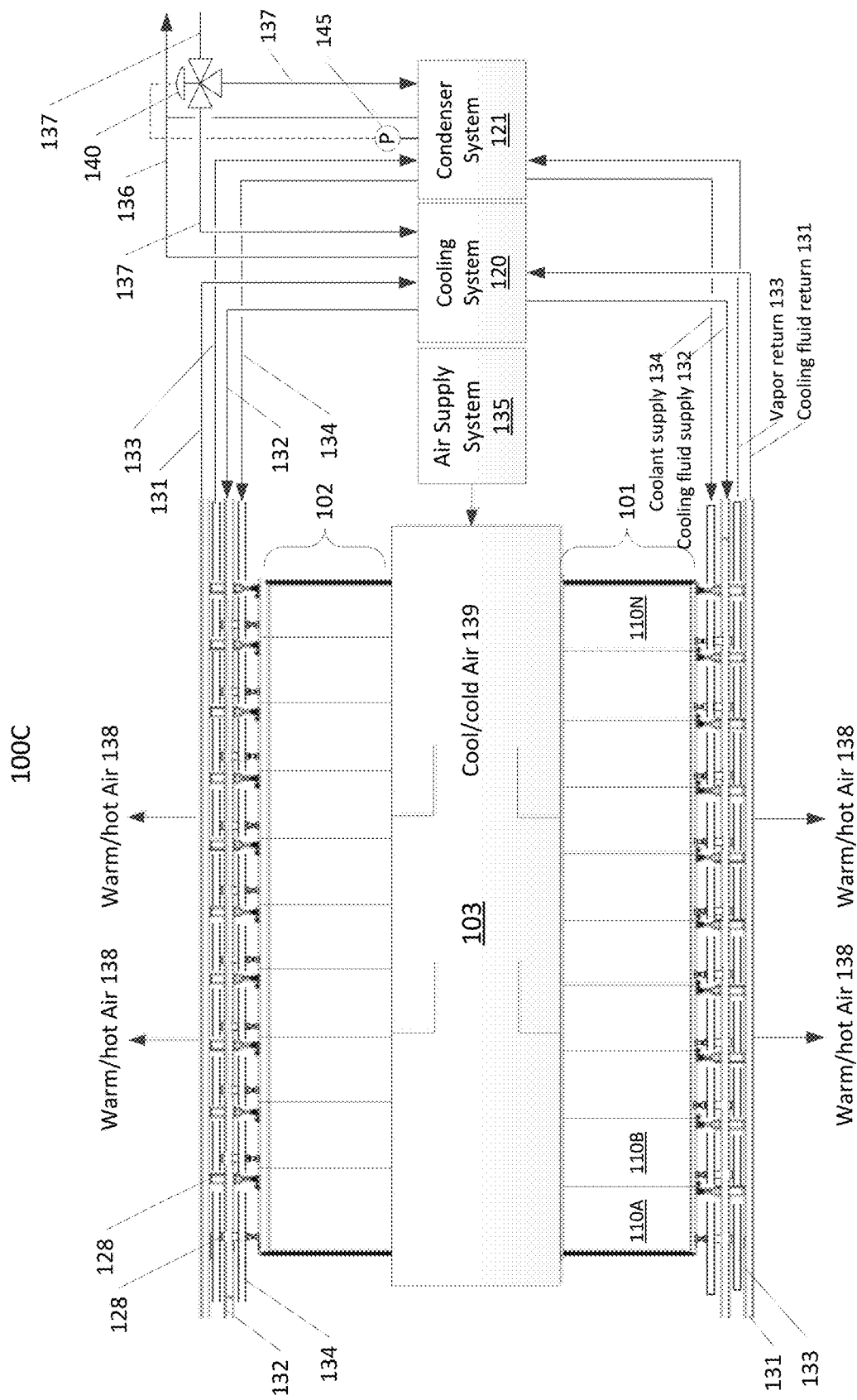
FIG. 1C is a block diagram illustrating an example of a data center facility according to one embodiment.

FIG. 1C is a block diagram illustrating an example of a data center 100C according to one embodiment. In this example, FIG. 1C shows a top view of at least a portion of a data center 100C. Referring to FIG. 1C, according to one embodiment, data center system 100A includes one or more rows of electronic racks of information technology (IT) components, equipment or instruments 101-102, such as, for example, computer servers or computing nodes that provide data services to a variety of clients over a network (e.g., the Internet).

In this embodiment, each row includes an array of electronic racks such as electronic racks 110A-110N. However, more or fewer rows of electronic racks may be implemented. Typically, rows 101-102 are aligned in parallel with front ends facing towards each other and back ends facing away from each other, forming aisle 103 in between to allow an administrative person walking therein. Cool/cold air 139 enters aisle 103 from an air supply system 135. However, other configurations or arrangements may also be applied. For example, two rows of electronic racks may back to back face each other without forming an aisle in between, while their frontends face away from each other. The back ends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a plurality of cooling liquid manifolds (not shown), a number of server slots (e.g., standard shelves or chassis configured with an identical or similar form factor), and a number of server chassis (also referred to as server blades or server shelves) capable of being inserted into and removed from the server slots.

Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 and condenser or two-phase ("condenser") cooling system 121 may be coupled to multiple data center systems such as data center system 100C.

In one embodiment, cooling systems 120 and 121 include an external liquid loop, facility cooling fluid return line 136 and facility cooling fluid supply line 137, connected to a cooling tower or a dry cooler external to the building/housing container. The cooling system 120 can include, but is not limited to a counter-flow heat exchanger, evaporative cooling, free air, rejection to large thermal mass, and waste heat recovery designs. Cooling system 121 can be an evaporative cooling system with a condenser or quenching system. Cooling system 120 and cooling system 121 (or "condenser system 121") may include or be coupled to a facility cooling liquid source, such as a facility cooling liquid, that provides facility cooling fluid to cooling system 120 and cooling system 121. An amount of facility cooling fluid 137 provided to each of cooling system 120 and cooling system 121 can be adjusted using the 3-way flow control device 140 to direct some of the facility cooling fluid 137 to cooling system 120 and some of facility cooling fluid 137 to cooling system 121

A second cooling system 121 can be a two-phase cooling system. Two-phase cooling system 121 can use a different working fluid than single-phase cooling system 120. The working fluid in the second cooling system 121 can be selected such that the working fluid evaporates at a design temperature threshold. Two-phase cooling system 121 can include a pressure sensor 145 that can measure changes in vapor pressure in the vapor return line 133. Pressure sensor 145 can be located in a variety of locations along the vapor return line 133 as may be appropriate for the sensor 145 detecting a change in vapor pressure within the vapor return line 133.

In an embodiment, each electronic rack can include one or more cooling liquid manifolds (not shown) for a cooling loop of each cooling system 120 and 121. Each server within the electronic rack can be coupled to an available fluid connector on a cooling liquid manifold using, e.g., a connection hose assembly 128. In one embodiment, each server chassis is coupled to a cooling liquid manifold modularly, such that a server chassis can be removed from the electronic rack without affecting the operations of remaining server chassis in the electronic rack and the cooling liquid manifold.

In another embodiment, each server chassis is coupled to the cooling liquid manifold through a quick-release coupling assembly having a server liquid intake connector and a server liquid outlet connector coupled to a flexible hose to distribute the cooling liquid to cold plates to which the processors are coupled. The server liquid intake connector is to receive cooling liquid via a rack liquid intake connector from a cooling liquid manifold mounted on a backend of the electronic rack. The server liquid outlet connector is to emit single-phase cooling fluid, or two-phase vapor, carrying the heat exchanged from the processors, to the cold plate(s), to the cooling liquid manifold via a rack liquid outlet connector.

In one embodiment, the cooling liquid manifolds disposed on the backend of each electronic rack are coupled to single-phase cooling fluid supply line 132 (also referred to as a room supply manifold) to receive cooling liquid from cooling system 120. Another cooling liquid manifold disposed on the backend of each electronic rack can be coupled to two-phase coolant supply line 134 the second cooling system 121. The cooling liquids 131 and 132 of the first cooling system 120 are distributed through a first cooling loop of the first cooling system attached to a cold plate assembly on which a processor is mounted to remove heat from the processor.

A cold plate is configured similar to a heat sink with a liquid distribution tube attached or embedded therein. The resulting warmer or hotter liquid carrying the heat exchanged from the processors is transmitted via single-phase cooling fluid return line 131 (also referred to as a room return manifold) back to cooling system 120. Similarly, two-phase coolant supply 134 and vapor return 133 of the second cooling system 121 are distributed through a second cooling loop of the second cooling system attached to the cold plate assembly on which the processor is mounted to remove heat from the processor.

As in the server cooling system described with respect to FIG. 1A, and the server cluster cooling system described with respect to FIG. 1B, in an embodiment the first plurality of heat-generating components cooled by the first cooling loop can be the same plurality of heat-generating components as the second plurality of heat-generating components that can be additionally, or alternatively, cooled by the second cooling loop. The second cooling system 121 can be operated as a fully redundant cooling system with the first cooling system 120 such that a same plurality of heat-generating components in one or more servers is cooled by the first cooling system, the second cooling system, or a controllably variable combination of both the first and second cooling systems.

Facility cooling fluid supply line 137 and facility cooling fluid return line 136 are referred to as data center or facility liquid supply/return lines (e.g., global liquid supply/return lines), which supply cooling liquid to cooling system 120 and cooling system 121. Cooling systems 120 and 121 each have a cooling loop that is run to all of the electronic racks of rows 101-102. Cooling system 120 has a cooling loop comprising single-phase cooling fluid supply 132 and single-phase cooling fluid return 131 that is coupled to all of the electronic racks of rows 101-102. Cooling system 121 has a cooling loop comprising two-phase coolant supply 134 and vapor return line 133 that can be run to all of the electronic racks of works 101-102.

In one embodiment, data center system 100C further includes an optional airflow delivery system ("air supply system") 135 to generate a cold airflow 139 to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air 139 to circulate from aisle 103 through electronic racks 110A-110N to carry away exchanged heat as warm/hot air 138.

The cool airflows 139 enter the electronic racks through their frontends and the warm/hot airflows 138 exit the electronic racks from their back ends. The warm/hot air 138 with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

Figure 2:
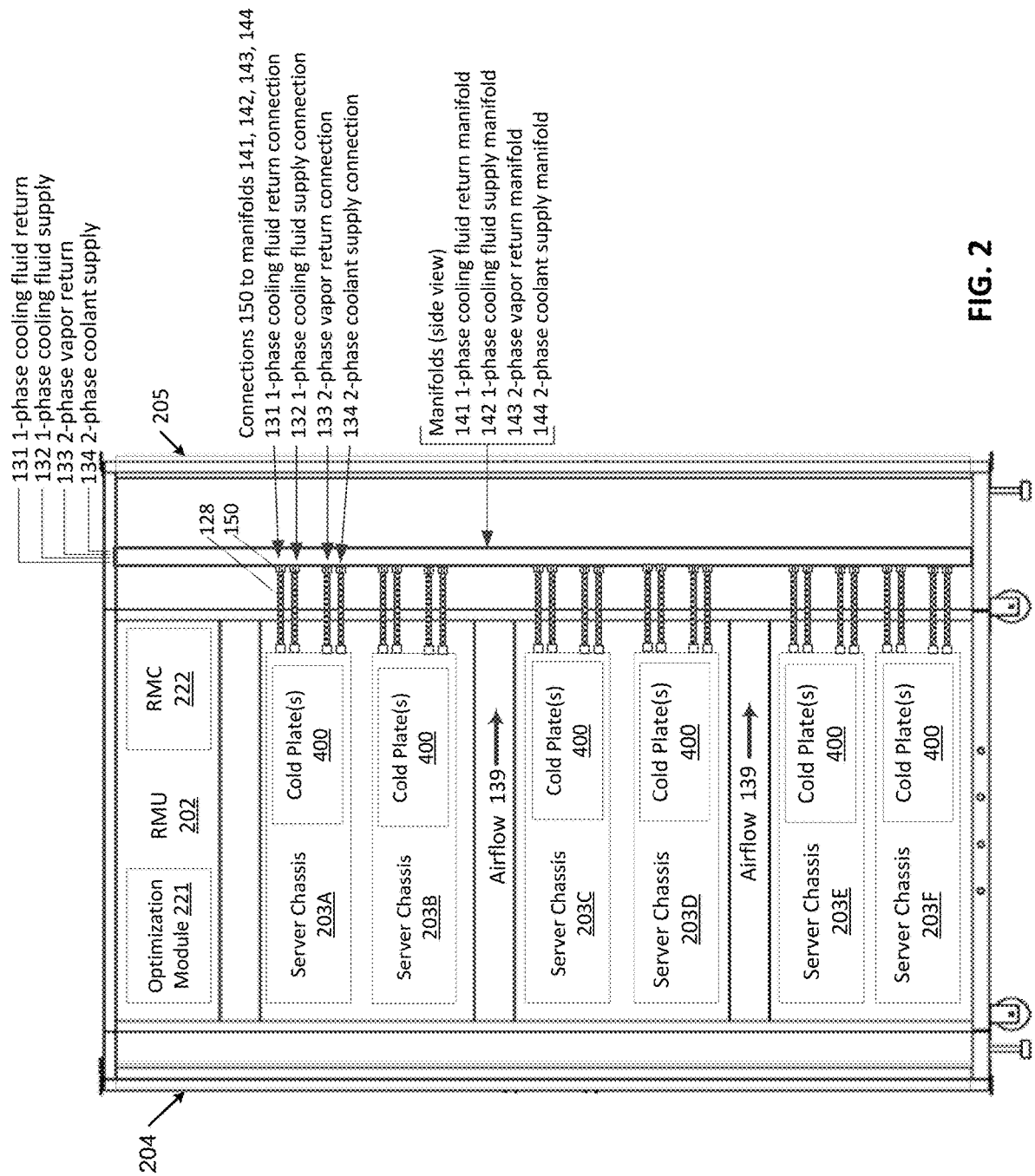
FIG. 2 is a block diagram illustrating an example of a side view of an electronic rack according to one embodiment.

FIG. 2 is block diagram illustrating an electronic rack 200 according to one embodiment. Electronic rack 200 may represent any of the electronic racks as shown in FIGS. 1A-1C, such as, for example, electronic racks 110A-110N, 200, or 200A-200C. Referring to FIG. 2, according to one embodiment, electronic rack 200 includes, but is not limited to, rack management unit (RMU) 202, and one or more server chassis 203A-203F (collectively referred to as server chassis 203). Server chassis 203 can be inserted into an array of server slots (e.g., standard shelves) respectively from frontend 204 or backend 205 of electronic rack 200. Note that although there are six server chassis 203A-203F shown here, more or fewer server chassis may be maintained within electronic rack 200. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the back ends of server chassis 203 or on the electronic rack to generate airflows flowing from frontend 204, traveling through the air space of the sever chassis 203, and existing at backend 205 of electronic rack 200.

Each of server chassis 203 may include one or more IT components (e.g., central processing units or CPUs, general/ graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server).

The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The computer servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 (not shown) and rack management controller (RMC) 222. RMC 222 may include a monitor to monitor operating status of various components within electronic rack 200, such as, for example, computing nodes 203, and the fan modules. Specifically, the RMC 222 receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules 231 and liquid pump 212, which may be proportional to their respective speeds. These operating data are referred to as real-time operating data. Note that the monitor may be implemented as a separate module within RMU 202.

Note that the rack configuration as shown in FIG. 2 is shown and described for the purpose of illustration only; other configurations or arrangements may also be applicable. The cold plates 400 of server chassis 203 may be coupled to a rack manifold, e.g. 141-144, which may be directly coupled to first coolant loop 131-132 and second coolant loop 133-134. Each server 203 can be coupled to manifolds 141-143. Each server 203 can route single-phase cooling fluid supply and return 132/131 ("the single-phase cooling loop") to one or more cold plates and can also route two-phase coolant supply and vapor return 134/133 ("the two-phase cooling loop") to one or more cold plates in server 203. In an embodiment, one or more, or all, cold plates can be coupled to both the single-phase cooling loop and the two-phase cooling loop.

Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
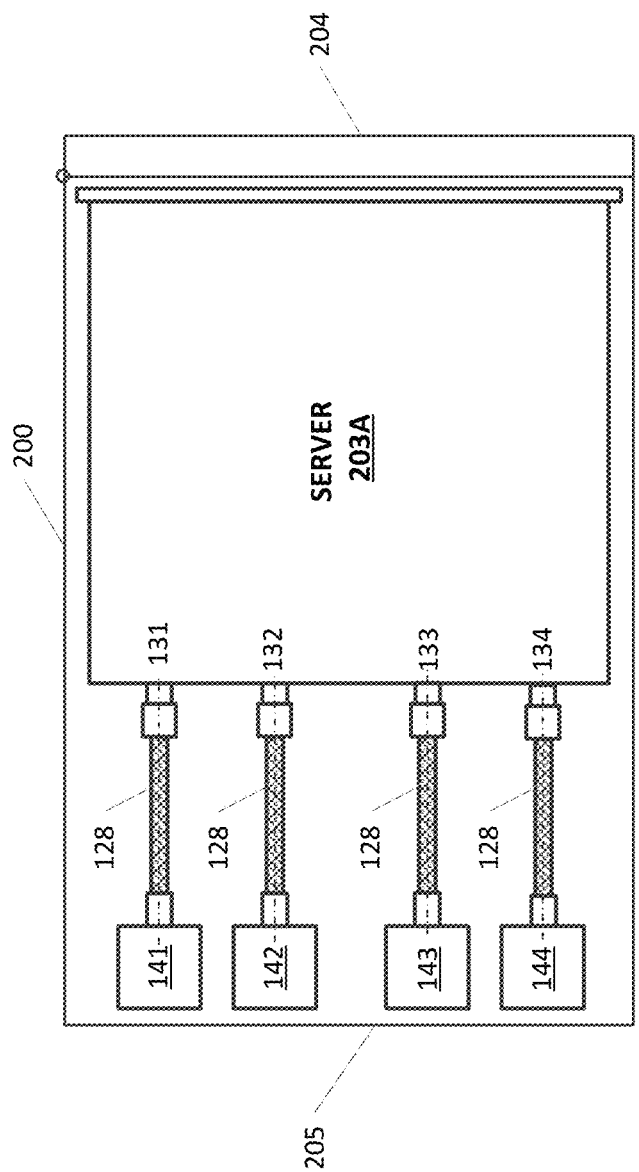
FIG. 3 is a block diagram illustrating an example of a top view of an electronic rack accordance to one embodiment.

FIG. 3 is a block diagram illustrating a top view of a sever 203A in an electronic rack 200, according to one embodiment. The front of the electronic rack 200 is labeled 204, while the rear of the electronic rack is labeled 205. As described above, first cooling system 120 can include a first cooling loop have a single-phase cooling fluid supply line 132 and a single-phase cooling fluid return line 131. The single-phase cooling fluid supply line 132 can be coupled to a manifold 142 installed in the rear 205 of the electronic rack 200 using, e.g. a hose connection 128. The single-phase cooling fluid return line 131 can be coupled to manifold 141 using e.g. a hose connection 128.

Similarly, the second cooling system can have a second cooling loop having two-phase cooling fluid supply 134 that can be coupled to manifold 144. The vapor return line 133 can be coupled to manifold 143 using e.g. a hose connection 128. Any server 203 having a heat-generating device that is to be coupled to the first cooling system can couple to manifolds 141 and 142 in electronic rack 200 using a host connection 128. Similarly, any server having a heating generating device that is to be coupled to the second cooling loop can be coupled to manifolds 133 and 134 in electronic rack 200 using a hose connection 128. The servers are cooled using two cooling loops and each cooling loop includes two manifold-to-server connections: one inlet ("supply") and one outlet ("return"). The actual cooling components in the server, such as a cold plate, are also designed for running two cooling loops. The design of the cooling plate for running two cooling loops is not the subject of the present disclosure.

Figure 4:
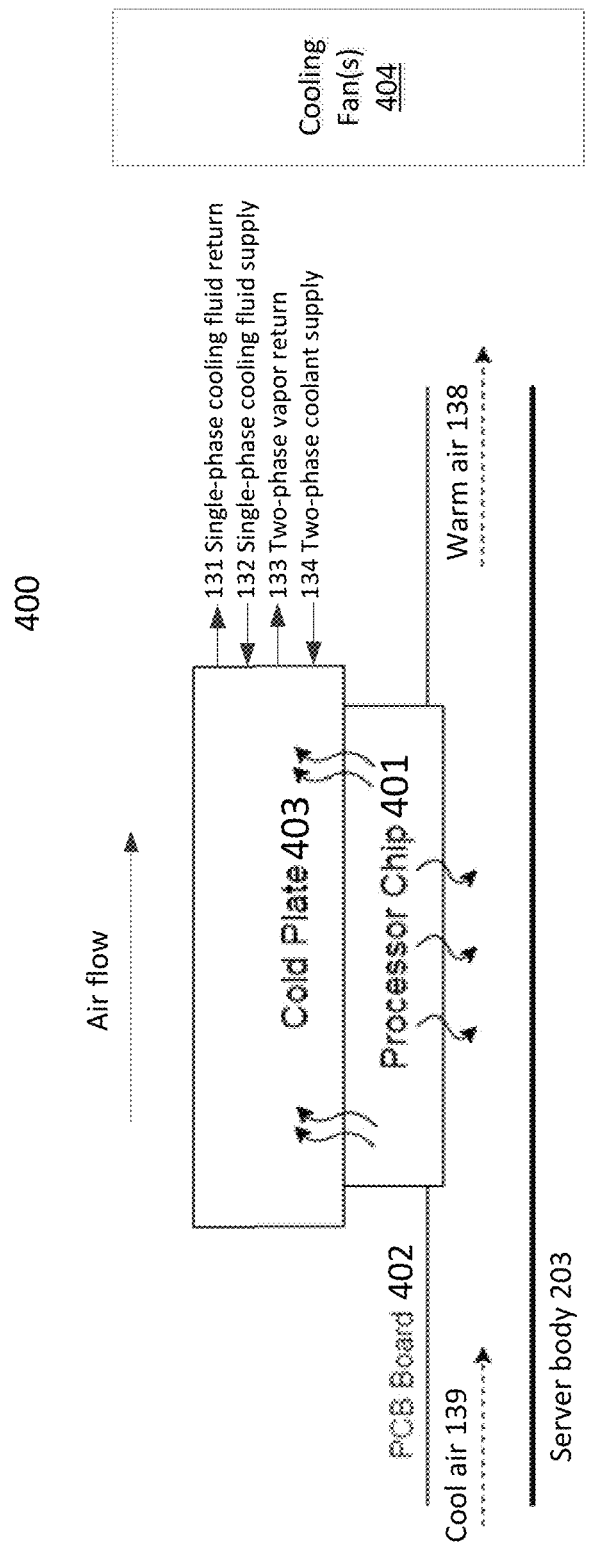
FIG. 4 is a block diagram illustrating an example of a cold plate configuration according to one embodiment.

FIG. 4 is a block diagram illustrating a processor cold plate configuration according to one embodiment. The processor/cold plate assembly 400 can represent any of the processors/cold plate structures of server chassis 203 as shown in FIG. 2. Referring to FIG. 4, processor 401 is plugged onto a processor socket mounted on printed circuit board (PCB) or motherboard 402 coupled to other electrical components or circuits of a data processing system or server. Processor 401 also includes a cold plate 403 attached to it, which is coupled to a plurality of rack manifolds (not shown) that are coupled to single-phase cooling fluid supply line 132 and single-phase cooling fluid return line 131, and two-phase coolant supply line 134 and vapor return line 133. A portion of the heat generated by processor 401 is removed by the cooling liquid(s) via cold plate 403. The remaining portion of the heat enters into an air space underneath or above, which may be removed by an airflow 139 generated by cooling fan 404. The cool air 139 passes through the air space which heats the air to become warm air 138, which is exhausted out the back of the electronic rack 200 (not shown) in which the server 203 is installed.

Figure 5:
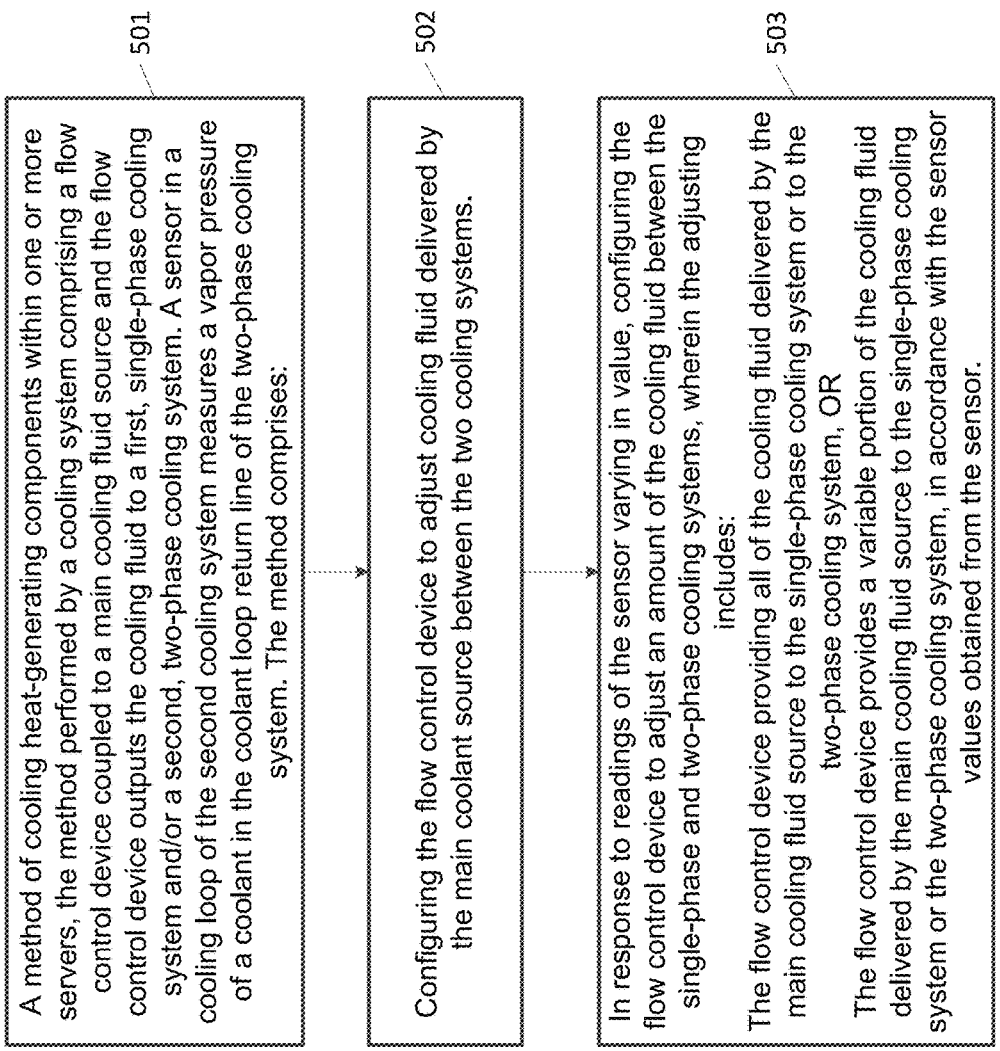
FIG. 5 illustrates a flow diagram of a method of cooling using a multiple phase multiple cooling system architecture according to one embodiment.

FIG. 5 illustrates a flow diagram 500 of a method of cooling heat-generating components within one or more servers in one or more electronic racks. In operation 501, the method is performed on a cooling system comprising a flow control device coupled to a facility cooling liquid. The flow control device is configured to output the facility cooling liquid to a first, single-phase cooling system and/or a second, two-phase cooling system. A sensor 145 measures a vapor pressure of a vapor return 133 within a circulation loop of the second, two-phase cooling system. The properties of the two-phase coolant are selected by design such that the two-phase coolant will vaporize at a design temperature in a range which a second plurality of heat-generating devices are designed to operate.

In operation 502, the flow control device (140) is configured to adjust an amount of facility cooling liquid supply between the first (120) and second (121) cooling systems.

In operation 503, in response to readings of the sensor (145) varying in value, the flow control device (140) is configured to adjust an amount of the facility cooling fluid supply line 137 between the single-phase cooling system (120) and the two-phase cooling system (121). The adjusting includes: (1) the flow control device (140) providing all of the facility cooling fluid supply line 137 received from the facility cooling liquid source to the single-phase cooling system (120) or to the two-phase cooling system (121), or (2) the flow control device (140) provides a variable portion of the facility cooling fluid supply line 137 received from the facility cooling liquid source to the single-phase cooling system (120) or the two-phase cooling system (121), in accordance with the sensor values obtained from the sensor (145).

In the foregoing specification, embodiments of the invention have been described with reference to specific exemplary embodiments thereof. While rack orientations are shown as horizontal, this is not limiting. Different server rack orientations, e.g. vertical, or upward/downward, can be implemented using this disclosure. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data center cooling system, comprising:
   a flow control device having an inlet port coupled to a facility cooling fluid supply line;
   a first cooling system coupled to the facility cooling fluid supply line via a first outlet port of the flow control device, wherein the first cooling system provides a single-phase cooling fluid to at least one of a plurality of server chassis in an electronic rack;
   a second cooling system coupled to the facility cooling fluid supply line via a second outlet port of the flow control device, wherein the second cooling system provides a two-phase cooling fluid to at least one of the plurality of server chassis in the electronic rack;
   a sensor coupled to a vapor return line of the second cooling system; and a controller to control the flow control device to adjust the facility cooling fluid supply line between the first and second cooling systems, in response to a sensor signal received from the sensor.

2. The data center cooling system of claim 1, wherein in response to sensor value obtained from the sensor signal, the controller controls the flow control device to adjust an amount of facility cooling fluid from the facility cooling fluid supply line between the first and second cooling systems, wherein the facility cooling fluid is used to cool the single-phase cooling fluid and to condense vapor evaporated from the two-phase cooling fluid.

3. The data center cooling system of claim 2, wherein in response to the sensor value exceeding a predetermined threshold, the controller controls the flow control device to increase an amount of the facility cooling fluid to the second cooling system.

4. The data center cooling system of claim 1, wherein the flow control device comprises a 3-way control valve that is configured to provide:
   all of the facility cooling fluid to either the first cooling system or the second cooling system, or
   a first portion of the facility cooling fluid to the first cooling system, in accordance with one or more sensor values obtained from the sensor, and a second portion of the facility cooling fluid to the second cooling system.

5. The data center cooling system of claim 1, wherein the first cooling system is configured to remove heat from the single-phase cooling fluid circulating in a first cooling loop of the first cooling system that cools a first plurality of heat-generating components in at least one of the server chassis in the electronic rack.

6. The data center cooling system of claim 5, wherein the second cooling system comprises a two-phase condenser system that is configured to remove heat from the two-phase cooling fluid in a second two-phase cooling loop of the second cooling system that cools a second plurality of heat-generating components in at least one of the server chassis in the electronic rack, wherein at least one heat-generating component is in both the first plurality and the second plurality of heat-generating components, and the at least one heat-generating component is mounted to a cold plate that is cooled by both the first and second cooling loops.

7. The data center cooling system of claim 6, wherein the sensor comprises a pressure sensing device that measures vapor pressure in the second two-phase cooling loop in the second cooling system.

8. The data center cooling system of claim 1, wherein the first cooling system and second cooling system are integrated to a single cooling system.

9. The data center cooling system of claim 1, wherein the first cooling system is a primary cooling system and the second cooling system is a secondary cooling system.

10. The data center cooling system of claim 1, further comprising:
    a first liquid supply line and a second liquid return line coupled between the first cooling system and a single-phase manifold of the electronic rack; and
    a third liquid supply line and the vapor return line coupled between the second cooling system and a two-phase manifold of the electronic rack.

11. The data center cooling system of claim 1, wherein the electronic rack is one of a plurality of electronic racks coupled to the first cooling system and the second cooling system.

12. The data center cooling system of claim 11, wherein each of the electronic racks is coupled to the first cooling system via a pair of a liquid supply line and a liquid return line, and coupled to the second cooling system via a pair of a liquid supply line and a vapor return line.

13. A data center system, comprising:
    a facility cooling fluid supply line to receive cooling fluid from a cooling fluid source;
    a plurality of electronic racks, each of the electronic racks including a single-phase rack manifold for distributing a single-phase cooling fluid and a two-phase rack manifold for distributing a two-phase cooling fluid to one or more server chassis contained within the corresponding electronic rack; and a cooling system coupled to the electronic racks, the cooling system including:
a flow control device having an inlet port coupled to the facility cooling fluid supply line,
a first cooling system coupled to the facility cooling fluid supply line via a first outlet port of the flow control device, wherein the first cooling system provides a single-phase cooling fluid to at least one of the electronic racks,
a second cooling system coupled to the facility cooling fluid supply line via a second outlet port of the flow control device, wherein the second cooling system provides the two-phase cooling fluid to at least one of the electronic racks,
a sensor coupled to a vapor return line of the second cooling system, and
a controller to control the flow control device to adjust the facility cooling fluid supply line between the first and second cooling systems, in response to a sensor signal received from the sensor.

14. The data center system of claim 13, wherein in response to sensor value obtained from the sensor signal, the controller controls the flow control device to adjust an amount of facility cooling fluid from the facility cooling fluid supply line between the first and second cooling systems, wherein the facility cooling fluid is used to cool the single-phase cooling fluid and to condense vapor evaporated from the two-phase cooling fluid.

15. The data center system of claim 14, wherein in response to the sensor value exceeding a predetermined threshold, the controller controls the flow control device to increase an amount of the facility cooling fluid to the second cooling system.

16. The data center system of claim 13, wherein the flow control device comprises a 3-way control valve that is configured to provide:
all of the facility cooling fluid to either the first cooling system or the second cooling system, or
a first portion of the facility cooling fluid to the first cooling system, in accordance with one or more sensor values obtained from the sensor, and a second portion of the facility cooling fluid to the second cooling system.

17. The data cooling system of claim 13, wherein the first cooling system is configured to remove heat from the single-phase cooling fluid circulating in a first cooling loop of the first cooling system that cools a first plurality of heat-generating components in at least one of the server chassis.

18. An electronic rack, comprising:
a plurality of server chassis arranged in a stack, each server chassis to contain one or more servers therein and each server including one or more processors;
a single-phase manifold coupled to at least a portion of the sever chassis to distribute a single-phase cooling fluid to the server chassis;
a two-phase manifold coupled to at least a portion of the server chassis to distribute a two-phase cooling fluid to the server chassis, wherein each of the single-phase manifold and the two-phase manifold is coupled to a cooling system to receive and to return the single-phase cooling fluid and the two-phase cooling fluid respectively, wherein the cooling system comprises:
a flow control device having an inlet port coupled to a facility cooling fluid supply line,
a first cooling system coupled to the facility cooling fluid supply line via a first outlet port of the flow control device, wherein the first cooling system is coupled to the single-phase manifold to provide the single-phase cooling fluid to the sever chassis,
a second cooling system coupled to the facility cooling fluid supply line via a second outlet port of the flow control device, wherein the second cooling system is coupled to the two-phase manifold to provide the two-phase cooling fluid to the server chassis,
a sensor coupled to a vapor return line of the second cooling system, and
a controller to control the flow control device to adjust the facility cooling fluid supply line between the first and second cooling systems, in response to a sensor signal received from the sensor.

19. The electronic rack of claim 18, wherein in response to sensor value obtained from the sensor signal, the controller controls the flow control device to adjust an amount of facility cooling fluid from the facility cooling fluid supply line between the first and second cooling systems, wherein the facility cooling fluid is used to cool the single-phase cooling fluid and to condense vapor evaporated from the two-phase cooling fluid.

20. The electronic rack of claim 19, wherein in response to the sensor value exceeding a predetermined threshold, the controller controls the flow control device to increase an amount of the facility cooling fluid to the second cooling system.

* * * * *